United States Patent
Kurose et al.

(10) Patent No.: US 7,839,676 B2
(45) Date of Patent: Nov. 23, 2010

(54) MAGNETIC MEMORY DEVICE

(75) Inventors: Daisuke Kurose, Kawasaki (JP);
Masanori Furuta, Mishima (JP);
Tsutomu Sugawara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 12/407,156

(22) Filed: Mar. 19, 2009

(65) Prior Publication Data
US 2009/0237988 A1    Sep. 24, 2009

(30) Foreign Application Priority Data
Mar. 21, 2008    (JP) .............................. 2008-074291

(51) Int. Cl.
*G11C 11/14*    (2006.01)
(52) U.S. Cl. .............. 365/171; 365/189.09; 365/189.16
(58) Field of Classification Search ................. 365/171, 365/209, 189.011, 189.15, 189.16, 189.05, 365/189.09, 210.1
See application file for complete search history.

(56) References Cited

U.S. PATENT DOCUMENTS 6,879,513 B2 *   4/2005  Ooishi ......................... 365/158
7,057,925 B2 *   6/2006  Ooishi et al. ................. 365/171
7,313,017 B2 *  12/2007  Ooishi et al. ................. 365/171
7,596,014 B2 *   9/2009  Kawahara et al. ........... 365/158

FOREIGN PATENT DOCUMENTS

JP    2007-134027 A    5/2007
JP    2008-310868 A    12/2008

* cited by examiner

*Primary Examiner*—Gene N. Auduong
(74) *Attorney, Agent, or Firm*—Ohlandt, Greeley, Ruggiero & Perle, L.L.P.

(57) ABSTRACT

A magnetic memory device includes a plurality of word lines, a plurality of bit lines arranged to intersect with the word lines, an MRAM cell array including a plurality of magnetic random access memory (MRAM) cells arranged at intersection portions between the word lines and the bit lines, a read current source which supplies a read current to the MRAM cells in a read mode, a sense amplifier which detects terminal voltages of the MRAM cells generated by the read current to generate a detection output signal, a latch circuit which latches the detection output signal to output read data, and a data write circuit which supplies a write current to the MRAM cells depending on write data in a write mode to perform writing and which supplies the write current to the MRAM cells depending on the read data in the read mode to perform rewriting.

18 Claims, 5 Drawing Sheets

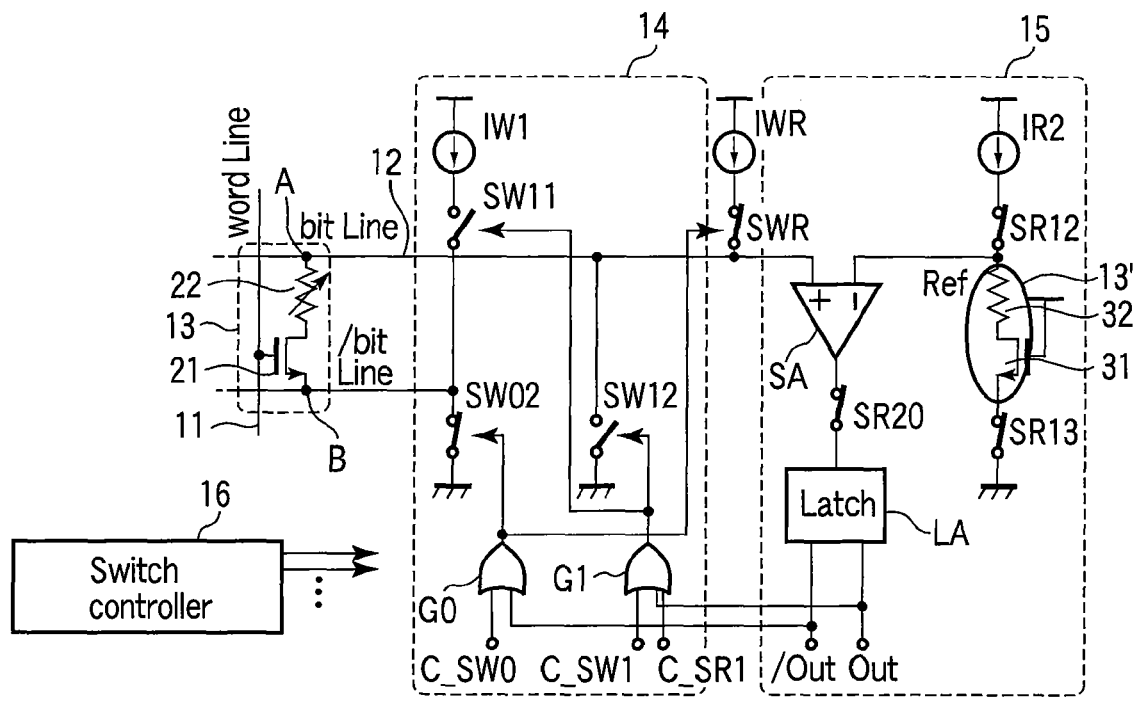
F I G. 3
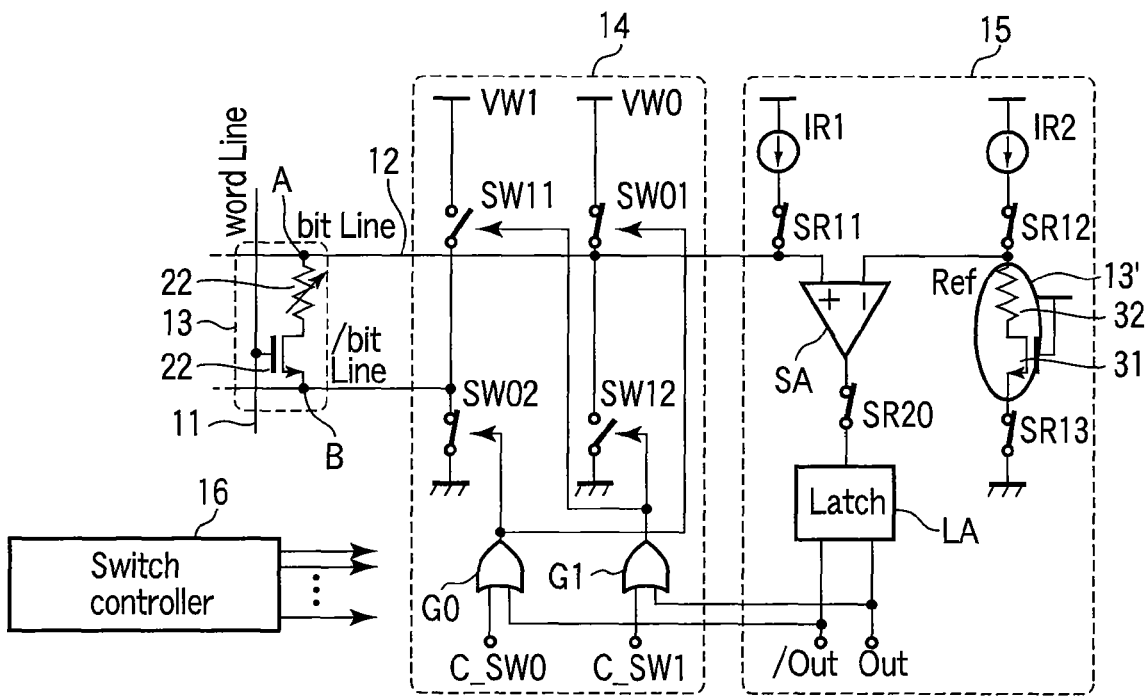
F I G. 4

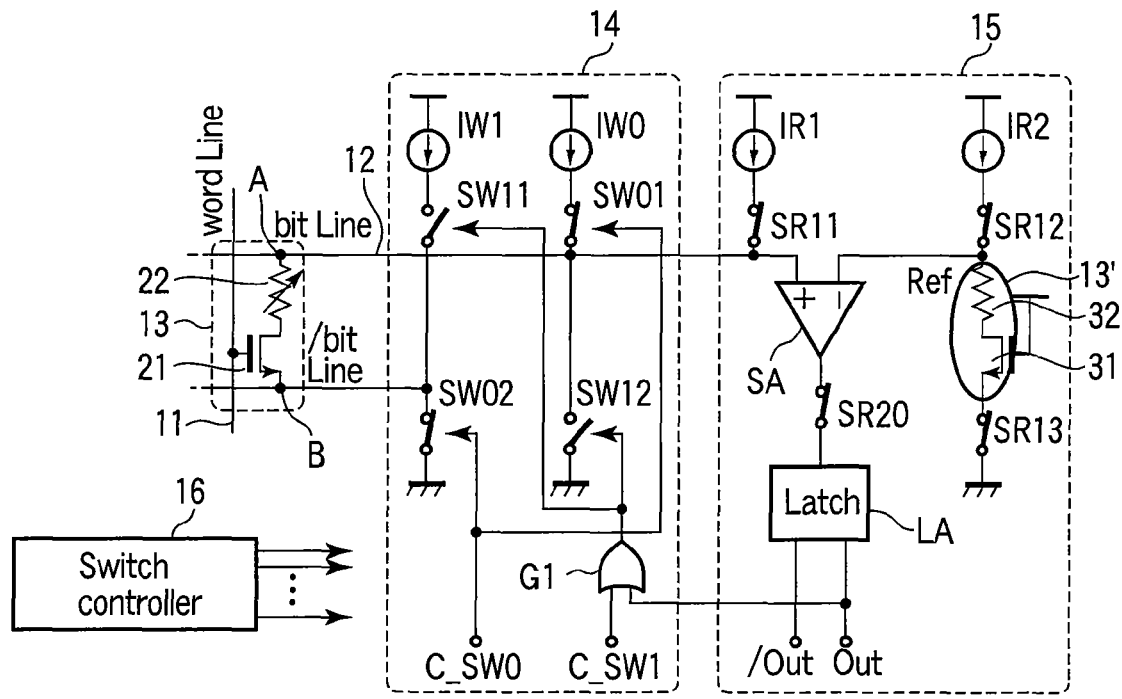
F I G. 5
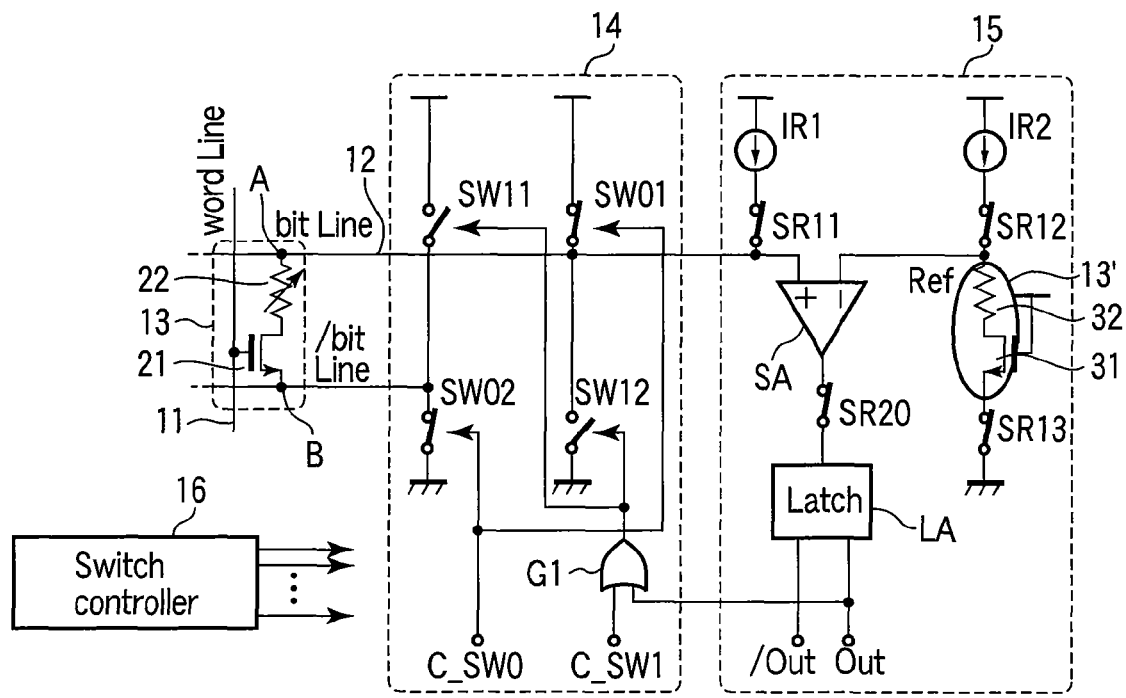
F I G. 6

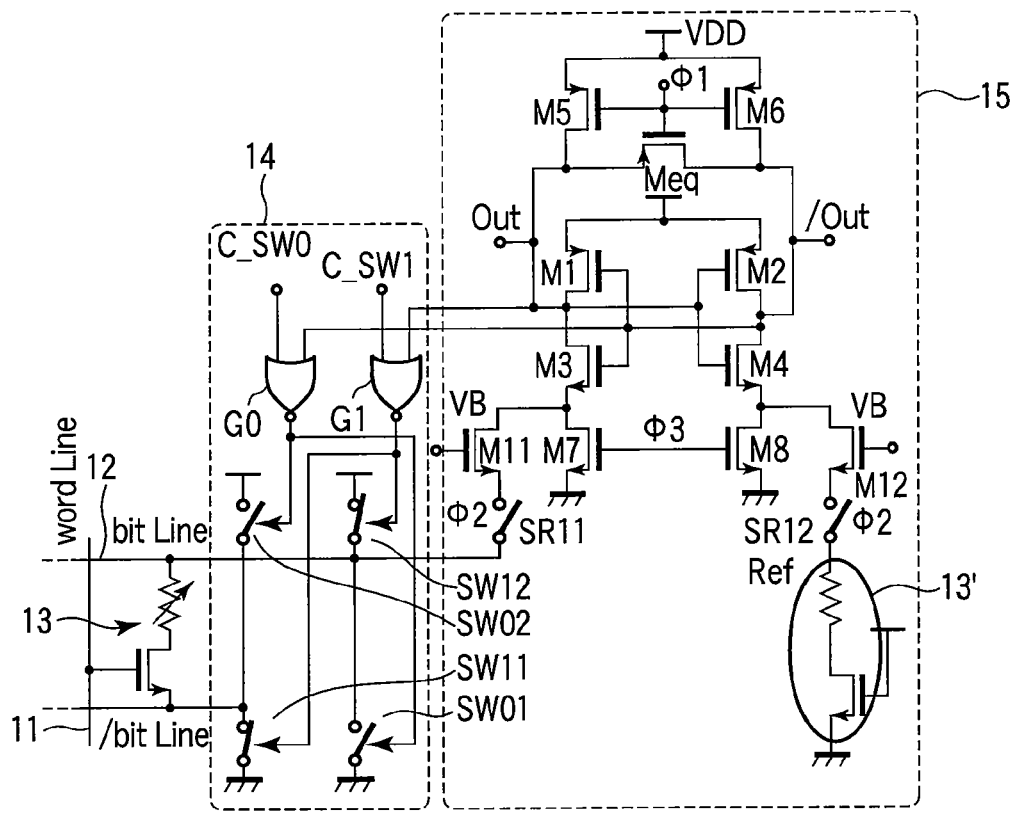
F I G. 7
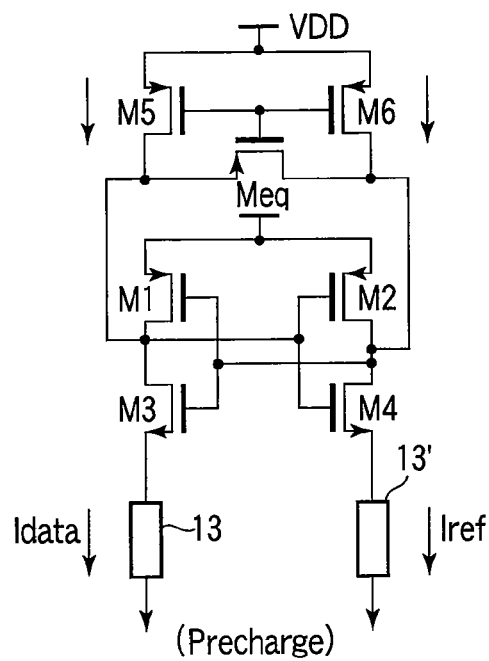
F I G. 8

(Amplification)

(Latch+Rewrite)

MAGNETIC MEMORY DEVICE

CROSS-REFERENCE TO RELATED APPLICATIONS

This application is based upon and claims the benefit of priority from prior Japanese Patent Application No. 2008-074291, filed Mar. 21, 2008, the entire contents of which are incorporated herein by reference.

BACKGROUND OF THE INVENTION

1. Field of the Invention

The present invention relates to a magnetic memory device and, in particular, a magnetic random access memory (MRAM).

2. Description of the Related Art

A magnetic random access memory (MRAM) attracts attention as a memory device having high erase/write endurance and a high access speed. A storage element used as the MRAM has a structure in which a magnetic material element such as a magnetic tunnel junction (MTJ) element and a transistor operated as a switch are connected in series with each other, and is called an MRAM cell.

As a data write scheme in the MRAM, a magnetic field writing scheme has been conventionally used. In the magnetic field writing scheme, a magnetic field is applied to the MTJ element to write "0" or "1". A read operation is performed by indirectly measuring an electric resistance of the MTJ element by a current of the MTJ element or a voltage across both the ends of the MTJ element.

On the other hand, as a data write scheme in the MRAM in recent years, a spin injection write scheme which is advantageous for achieving area reduction has been studied. In the spin injection scheme, "0" or "1" is written by changing a direction of current flowing to a MTJ element.

A method of reading data of a spin injection MRAM is basically the same as that in a magnetic field writing MRAM. More specifically, a current flowing in an MTJ element of an MRAM cell or a voltage across both the ends of the MTJ element is measured, and an electric resistance of the MTJ element is indirectly measured to perform a read operation. In the write operation, a reference cell having a reference MTJ element having a resistance obtained by imitating an intermediate resistance between a high resistance and a low resistance of the MTJ element of the MRAM cell is used. A constant current is caused to flow in the MRAM cell and the reference cell, and a difference voltage generated by a difference between the resistances of the MTJ elements of both the cells is amplified by a sense amplifier. A detection output signal from the sense amplifier is latched by a latch circuit to decide read data (digital value).

As described above, in the spin injection MRAM, in any one of a data write mode and a data read mode, a current is supplied to the MTJ element of the MRAM cell. Therefore, when the read current is large, data is erroneously written, and the stored data is disadvantageously damaged. In particular, in the above example, a current generated when "0" is written in the MTJ element and a current generated when "1" is read from the MTJ element have the same direction. For this reason, when "1" is written in the MTJ element, data may be damaged in a read operation. This phenomenon is called "read disturb".

In order to avoid the read disturb, a read current may be reduced. However, in this case, a level of the detection output signal decreases. For this reason, a data read rate, i.e., an access rate disadvantageously decreases.

On the other hand, as a method of avoiding the read disturb without decreasing the access rate, a method of shortening a read time as compared to a write time is proposed (JP-A 2007-134027 (KOKAI)). JP-A 2007-134027 (KOKAI) describes that a read current is set at a position having a margin from a magnetization inverted region to make it possible to suppress read disturb.

MRAM cells the number of which is equal to a bit rate of a memory capacity are used. Magnetization inversion characteristics of the MTJ elements vary due to fluctuations in MTJ elements. Therefore, even when a read current is reduced, or even when a read time is made shorter than a write time, read margins of the MTJ elements of all the MRAM cells cannot be easily secured in manufacture. In particular, in a spin injection scheme suitable for a mass-storage volume, since a large number of MTJ elements are used, a yield disadvantageously decreases.

BRIEF SUMMARY OF THE INVENTION

According to one aspect of the present invention, there is provided a magnetic memory device comprising: a plurality of word lines; a plurality of bit lines arranged to intersect with the word lines; an MRAM cell array including a plurality of magnetic random access memory (MRAM) cells arranged at intersection portions between the word lines and the bit lines; a read current source which supplies a read current to the MRAM cells in a read mode; a sense amplifier which detects terminal voltages of the MRAM cells generated by the read current to generate a detection output signal; a latch circuit which latches the detection output signal to output read data; and a data write circuit which supplies a write current to the MRAM cells depending on write data in a write mode to perform writing and which supplies the write current to the MRAM cells depending on the read data in the read mode to perform rewriting.

According to another aspect of the present invention, there is provided a magnetic memory device comprising: a plurality of word lines; a plurality of bit lines arranged to intersect with the word lines; a plurality of magnetic random access memory (MRAM) cells arranged at intersection portions between the word lines and the bit lines; a MRAM cell array including a plurality of MRAM cells arranged at the intersection points between the word lines and the bit lines; a read current source which supplies a read current to the MRAM cells in a predetermined direction in a read mode; a sense amplifier which detects terminal voltages of the MRAM cells generated by the read current to generate a detection output signal; a latch circuit which latches the detection output signal to output read data; and a data write circuit which supplies a write current to the MRAM cells in a direction depending on write data in a write mode to perform writing and which, when the direction of the write current is different from a direction of the read current in the read mode, supplies the write current to the MRAM cells depending on the read data to perform rewriting.

BRIEF DESCRIPTION OF THE SEVERAL VIEWS OF THE DRAWING

FIG. 3 is a circuit diagram showing a write/data read circuit in a magnetic memory device according to a second embodiment;

FIG. 4 is a circuit diagram showing a write/data read circuit in a magnetic memory device according to a third embodiment;

FIG. 5 is a circuit diagram showing a write/data read circuit in a magnetic memory device according to a fourth embodiment;

FIG. 6 is a circuit diagram showing a write/data read circuit in a magnetic memory device according to a fifth embodiment;

FIG. 7 is a circuit diagram showing a write/data read circuit in a magnetic memory device according to a sixth embodiment;

FIG. 8 is a circuit diagram showing an equivalent circuit in a precharge mode to explain an operation in FIG. 7;

DETAILED DESCRIPTION OF THE INVENTION

The embodiments will be described below in detail with reference to the drawings.

First Embodiment

Figure 1:
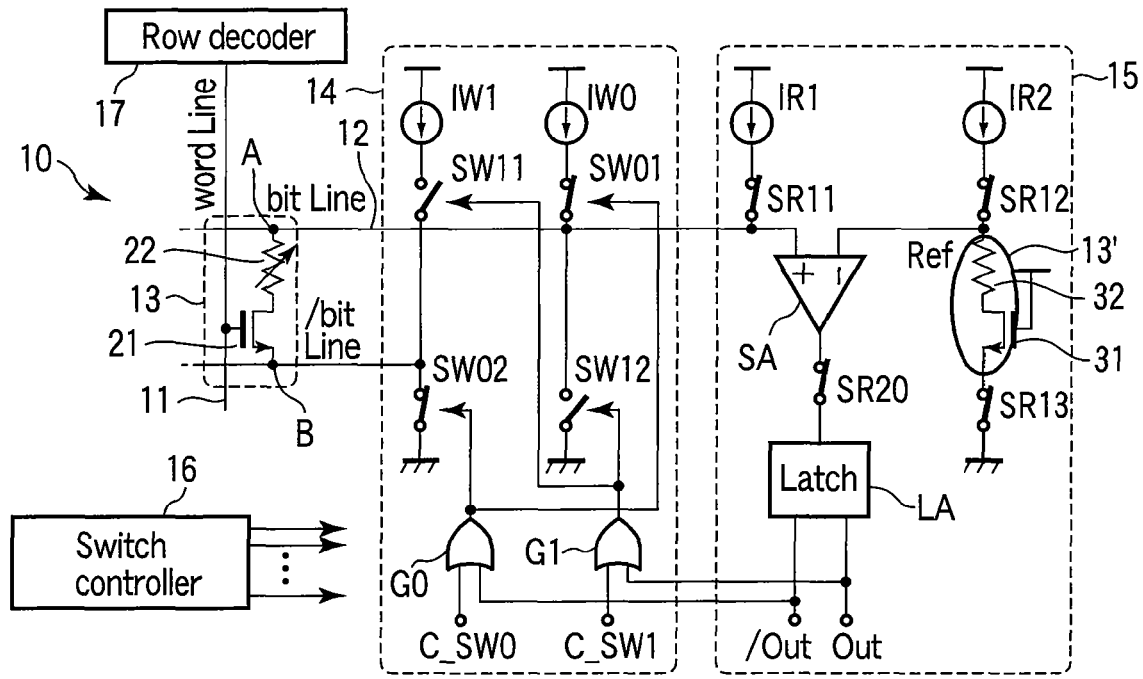
FIG. 1 is a circuit diagram showing a write/data read circuit in a magnetic memory device according to a first embodiment.

FIG. 1 shows an MRAM cell array, a data write circuit, and a data read circuit in a magnetic memory device according to a first embodiment of the present invention. In an MRAM cell array 10, a plurality of MRAM cells 13 is arrayed in the form of a matrix at intersection points between a plurality of word lines 11 and a plurality of bit lines 12. In FIG. 1, only one MRAM cell 13 is shown. The MRAM cell 13 is constituted by the MTJ element 22 and a MOS transistor 21 used as a switch. The MTJ element 22 and the MOS transistor 21 are connected in series with each other. The MTJ element 22 is a magnetic material element having an electric resistance changing depending on data to be stored. For example, when data "0" is stored in the MTJ element 22, the MTJ element 22 exhibits a low resistance. When data "1" is stored in the MTJ element 22, the MTJ element 22 exhibits a high resistance.

One ends of the MRAM cells on the same row, for example the source terminals or drain terminals of the transistors 21 are connected to the same bit line 12. Gate terminals of the transistors 21 in the MRAM cells on the same row are connected to the same word line 13. A row decoder 17 is connected to the word line 13.

A data write circuit 14 and a data read circuit 15 are connected between the adjacent bit lines 12. In a data write mode for the MRAM cell 13 and a read mode of data stored in the MRAM cell 13, one word line 11 is selected by the row decoder 17. Only the transistor 21 in the MRAM cell 13 connected to the selected word line 11 is turned on to form a current path. In this state, data is written by the data write circuit 14, or data is read by the data read circuit 15. The data write circuit 14 and the data read circuit 15 will be described below.

(Data Write Circuit 14)

It is assumed that, when a write current flows in a direction of A→B, the MTJ element 22 of the MRAM cell 13 exhibits a low resistance because data "0" is written and that, when a write current flows in direction of B→A, the MTJ element 22 exhibits a high resistance because data "1" is written.

The data write circuit 14 has a write current sources IW0 and IW1 serving as constant current sources, write switches SW01, SW02, SW11, and SW12, and OR circuits G0 and G1. Current source IW0, switches SW01 and SW02, and the OR circuit G0 are used to write data "0". The write current source IW1, write switches SW11 and SW12, and the OR circuit G1 are used to write data "1".

More specifically, when switches SW01 and SW02 are turned on, and switches SW11 and SW12 are turned off, a write current flows in the MTJ element 22 in a direction of A→B through a path constituted by current source IW0, write switch SW01, the upper bit line 12, the MTJ element 22, the lower bit lines 12, write switch SW02, and GND (ground) in this order to write the data "0" in the MTJ element 22. In contrast to this, when switches SW11 and SW12 are turned on, and when switches SW01 and SW02 are turned off, a write current in the MTJ element 22 in a direction of B→A through a path constituted by current source IW1, write switch SW11, the lower bit line 12, the MTJ element 22, the upper bit line 12, write switch SW12, and GND in this order to write the data "1" in the MTJ element 22.

The data write circuit 14 performs a data write operation for the MTJ element 22 according to write data (data to be written) input in a normal write mode. The write data has a pulse signal C_SW0 corresponding to a logical value "0" and a pulse signal C_SW1 corresponding to a logical value "1".

The OR circuit G0 calculates a logical sum between the pulse signal C_SW0 of the write data and a pulse signal /Out corresponding to the logical value "0" of data read from the data read circuit 15 (will be described later) to output a first logical sum signal. Similarly, the OR circuit G1 calculates a logical sum between the pulse signal C_SW1 of the write data and a pulse signal Out corresponding to the logical value "1" of the data read from the data read circuit 15 to output a second logical sum signal.

Write switches SW01 and SW02 are controlled by an output (first logical sum signal) from the OR circuit G0, and write switches SW11 and SW12 are controlled by an output (second logical sum signal) from the OR circuit G1. More specifically, when the output from the OR circuit G0 goes to "H", switches SW01 and SW02 are turned on. When the output from the OR circuit G1 goes to "H", switches SW11 and SW12 are turned on.

In the conventional art, write switches SW01, SW02, SW11, and SW12 are controlled by the write data only in a normal write mode. In contrast to this, according to the embodiment, write switches Sw01 and SW02 are controlled by an output from the OR circuit G0, and write switches SW11 and SW12 are controlled by an output from the OR circuit G1. In this manner, even in a data read mode (will be described later), data is written (rewritten).

In the embodiment, as the two current sources IW0 and IW1 in the data write circuit 14, one current source may be commonly used. Similarly, as a read current source IR1 and a reference current source IR2 in the data read circuit 15, one current source may be commonly used.

(About Data Read Circuit 15)

The data read circuit 15 has a read current source IR1 and a reference current source IR2 which serve as constant current sources, read switches SR11, SR12, and SR13, a reference cell 13', a sense amplifier SA, a latch circuit LA, and a disconnecting switch SR20. The reference cell 13' has the same structure as that of the MRAM cells 13 to store data. More specifically, the reference cell 13' has an MTJ element 32 and a transistor 31. The MTJ element 32 of the reference cell 13' imitates an intermediate resistance between a high resistance and a low resistance of the MTJ element 22 of the MRAM cells 13. Switches SR11, SR12, SR13, and SR20 are controlled by a switch controller 16.

The read operation is performed by detecting a terminal voltage of the MTJ element 22 of the MRAM cells 13 basically generated by a read current by the sense amplifier SA. More specifically, in a read mode, switches SR11, SR12, SR13, SR20, and SW02 are turned on, and a read current flows in the MTJ element 22 in a direction of A→B through a path constituted by the read current source IR1, switch SR11, the upper bit line 12, the MTJ element 22, the lower bit line 12, and GND in this order. On the other hand, the same current as the read current flows in the reference cell 13' through the path constituted by the reference current source IR2, switch SR12, the reference cell 13', switch SR13, and GND in this order.

A difference voltage between the terminal voltage of the MTJ element 22 generated by the read current and a terminal voltage (reference voltage) of the MTJ element 32 of the reference cell 13' generated by a current from the reference current source IR2 is amplified by the sense amplifier SA to generate a detection output signal. In this case, in a state that the MTJ element 22 of the MRAM cells 13 has a high resistance, a potential of a non-inverted input terminal of the sense amplifier SA is set to be higher than a potential of an inverted input terminal when a constant current flows in the MRAM cells 13 and the reference cell 13'.

At this time, a detection output signal from the sense amplifier SA positively increases, the detection output signal is latched by the latch circuit LA through switch SR20, and read data goes to "1" (that is, Out goes to "H"). On the other hand, when the MTJ element 22 of the MRAM cells 13 stores "0" to exhibit a low resistance, a detection output signal from the sense amplifier SA negatively increases, and read data output from the latch circuit LA goes to "0" (that is, /Out goes to "H").

In this manner, the read data (pulse signals Out and /Out) output from the latch circuit LA in the read mode is output to the outside of the data read circuit 15 and also input to the data write circuit 14 to rewrite data.

Figure 2:
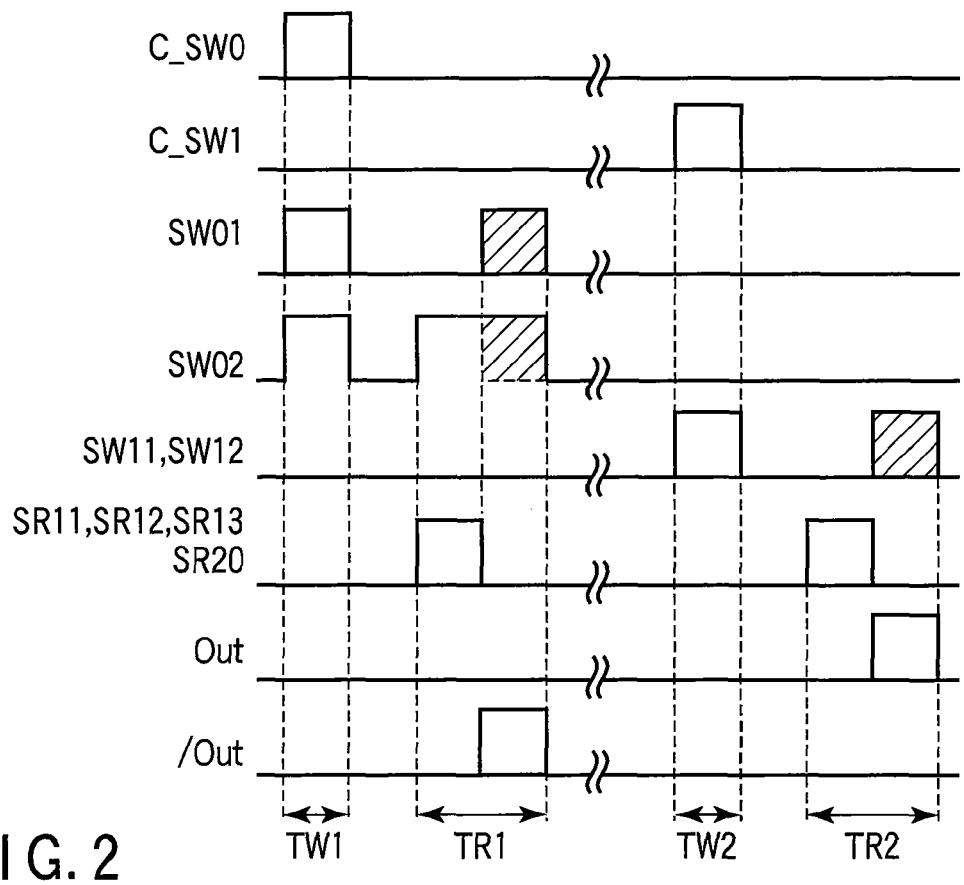
FIG. 2 is a timing chart showing an operation of the circuit in FIG. 1.

A write/read operation of the magnetic memory device in FIG. 1 will be described below in detail with reference to the time chart shown in FIG. 2. FIG. 2 shows timing relations between the units in FIG. 1. Reference symbols TW1 and TW2 denote write mode periods, respectively, and reference symbols TR1 and TR2 denote read mode periods, respectively. Hatching denotes rewriting of read data.

<Write Mode>

In the write mode period represented by TW1, write data is "0", i.e., C_SW0="1" and C_SW1="0" are satisfied. At this time, in the data write circuit 14, switches SW01 and SW02 are turned on, and switches SW11 and SW12 are turned off. For this reason, a write current flows in the MTJ element 22 of the MRAM cells 13 in a direction of A→B, and the data "0" is written in the MTJ element 22.

Similarly, in the write mode period represented by TW2, write data is "1", i.e., C_SW0="0" and C_SW1="1" are satisfied. At this time, in the data write circuit 14, switches SW11 and SW12 are turned on, and switches SW01 and SW02 are turned off. For this reason, a write current flows in the MTJ element 22 of the MRAM cells 13 in a direction of B→A, and the data "1" is written in the MTJ element 22.

<Read Mode>

In the read mode period represented by TR1 in which the data written in write period TW1 is read, all switches SR11, SR12, SR13, and SR20 in the data read circuit 15 and switch SW02 in the data write circuit 14 are turned on by the switch controller 16. At this time, as described above, a read current flows in the MTJ element 22 in a direction of A→B, and the same current as the read current also flows in the reference cell 13'.

In write period TW1, data "0" is written in the MTJ element 22 of the MRAM cells 13, and the MTJ element 22 exhibits a low resistance. More specifically, since the terminal voltage of the MTJ element 22 is low, the potential of the non-inverted input terminal of the sense amplifier SA is lower than the potential of the inverted input terminal. A detection output signal from the sense amplifier SA negatively increases, and the detection output signal is latched by the latch circuit LA through switch SR20.

Thereafter, switches SR11, SR12, SR13, and SR20 are turned off, and read data "0" (/Out="H") is output from the latch circuit LA. The read data is also input to the data write circuit 14. When /Out="H" is satisfied, an output from the OR circuit G0 goes to "H" in the data write circuit 14. For this reason, switches SW01 and SW02 are turned on. Therefore, a read current flows in the MTJ element 22 of the MRAM cells 13 in a direction of A→B again to rewrite data "0".

On the other hand, even in the read mode period which is represented by TR2 and in which data written in write period TW2 is read, the data is similarly rewritten. More specifically, when switches SR11, SR12, SR13, and SR20 in the data read circuit 15 are turned on, a read current flows in the MTJ element 22 in a direction of B→A.

In write period TW2, data "1" is written in the MTJ element 22 of the MRAM cells 13, and the MTJ element 22 exhibits a high resistance. Therefore, a terminal voltage of the MTJ element 22 increases, and the potential of the non-inverted input terminal of the sense amplifier SA is higher than the potential of the inverted input terminal. For this reason, a detection output signal from the sense amplifier SA positively increases, and the detection output signal is latched by the latch circuit LA.

Thereafter, when switches SR11, SR12, SR13, and SR20 are turned off, read data "1" (Out="H") is output from the latch circuit LA, and the read data "1" is input to the data write circuit 14. Since an output from the OR circuit G1 is at "H" due to Out="H", switches SW11 and SW12 are turned on. Therefore, a read current flows in the MTJ element 22 of the MRAM cells 13 in a direction of B→A again, and data "1" is rewritten.

As described above, according to the embodiment, since data is rewritten in the MTJ element 22 of the MRAM cells 13 by the read data in the read mode, data written by the read current can be avoided from being damaged, i.e., read disturb can be avoided. In this case, since the read current needs not be reduced to avoid the read disturb, a data read rate, i.e., an access rate is not sacrificed.

In JP-A 2007-134027 (KOKAI), as described above, in order to avoid read disturb without decreasing an access rate as described above, the read current is set at a position having a margin from a magnetization inverted region in the MTJ element to make a read time shorter than a write time. In this method, since magnetization inverting characteristics of the MTJ elements are different from each other due to a fluctuation in elements, a read margin cannot be easily secured for all the MTJ elements in manufacture, and a yield disadvantageously decreases.

In contrast to this, when the read disturb is suppressed by rewriting as in the embodiment, an especially large read margin is not required. For this reason, a yield of MRAMs can be increased.

In the embodiment, switch SW02 is turned on to connect the MRAM cell 10 to the ground at a point B in FIG. 1 in a read state. However, the present invention is not limited to this configuration, and any configuration in which the MRAM cell array 10 is connected to the MRAM cell 10 at the point B in FIG. 1 in a read state may be employed.

Second Embodiment

FIG. 3 shows a magnetic memory device according to a second embodiment of the present invention. In the first embodiment shown in FIG. 1, a direction of a read current supplied from the read current source IR1 to the MRAM cell 13 is the same as a direction of a read current supplied from the write current source IW0 to the MRAM cell 13 to write data "0". Therefore, in the second embodiment, as the write current source IW0 and the read current source IR1 in FIG. 1, one current source IWR is commonly used.

In this case, the read current and the write current must be equal to each other. However, this limitation may not be a serious problem because of the characteristic feature of the present invention that read disturb can be avoided without reducing the read current as described in the first embodiment.

Third Embodiment

FIG. 4 shows a magnetic memory device according to a third embodiment of the present invention. In the first and second embodiments, the constant current sources (IW0, IW1, and IWR) are used as write power supplies. However, in the third embodiment, write voltage sources VW0 and VW1 serving as constant voltage sources are used. Even when the data write circuit 14 writes data by using the constant voltage sources, data can be rewritten for the data read circuit 15 as in the first embodiment.

Fourth Embodiment

In the first to third embodiments, rewriting is always performed regardless of whether read data output from the latch circuit LA is "0" (/Out="H") or "1" (Out="H"). However, rewriting needs not be always performed. This is because read disturb mainly occurs when a direction of a write current in a data write state is different from a direction of a current in a data read state. Therefore, only when the direction is a direction of a read current in which the read disturb occurs, the read data may be rewritten.

FIG. 5 shows a magnetic memory device according to the fourth embodiment of the present invention based on this idea. In FIG. 5, the OR circuit G0 is removed from FIG. 1, and only data Out of read data output from the latch circuit LA is input to the data write circuit 14.

As described in the first embodiment, a read current flows in the MTJ element 22 of the MRAM cells 13 in a direction of A→B. In this case, read disturb occurs when a write current flows in the MTJ element 32 in a direction of B→A to write data "1". Therefore, in the embodiment, write switches SW11 and SW12 are turned on through the OR circuit G1 by the read data "1" (Out="H") output from the latch circuit LA only when the data "1" is written in the MTJ element 32, and the data "1" is rewritten.

Fourth Embodiment

FIG. 6 shows a magnetic memory device according to the fourth embodiment of the present invention obtained by combining the second embodiment and the third embodiment. More specifically, as in FIG. 4, constant voltage sources VW0 and VW1 are used as write power supplies, the OR circuit G0 is removed, and as in FIG. 5 only data Out of read data output from the latch circuit LA is input to the data write circuit 14.

In this manner, also in the configuration in which constant voltage sources VW0 and VW1 are used as write power supplies, rewriting can be performed only when the direction is a direction of a read current at which read disturb occurs.

Fifth Embodiment

A more concrete fifth embodiment will be described below with reference to FIG. 7. In FIG. 7, in particular, the data read circuit 15 will be more concretely described. In FIG. 7, relationships between the fifth embodiment and the first to fourth embodiments will be described. In the data write circuit 14, as in FIG. 4, write voltage sources VW0 and VW1 are used as write power supplies. However, current sources IW0 and IW1 may be used.

The latch circuit LA is configured by MOS transistors M1, M2, M3, and M4. MOS transistors M5 and M6 correspond to the read current source IR1 and the reference current source IR2, respectively. The sense amplifier SA is configured by MOS transistors M7 and M8.

An operation of the data read circuit 15 in FIG. 7 includes (a) a precharge mode, (b) an amplification mode, and (c) a latch+rewrite mode. The modes will be described below with reference to FIGS. 8, 9, and 10. In an initial state, control signals $\phi 1$, $\phi 2$, and $\phi 3$ from a switch controller 16 (not shown in FIG. 7) are set at "L".

(a) Precharge Mode

FIG. 8 shows an equivalent circuit in the precharge mode. The control signal $\phi 2$ is set at "H" to start precharging of a read current path. A precharge current (read current) flows from the precharge transistors M5 and M6 (PMOS transistors) to the MRAM cell 13 and the reference cell 13' through the cross-coupled transistors M3 and M4 (NMOS transistors) serving as a part of the latch circuit and clamp transistors M11 and M12 (NMOS transistors) not shown in FIG. 8.

In the precharge mode and a stable state, read data Out and /Out are set at a voltage close to a power supply voltage VSS by the precharge transistors M5 and M6 and an equalize transistor Meq (PMOS transistor). Therefore, the transistors M1 and M2 are in off states, and the latch circuit including the transistors M1 to M4 does not operate.

(b) Amplification Mode

Figure 9:
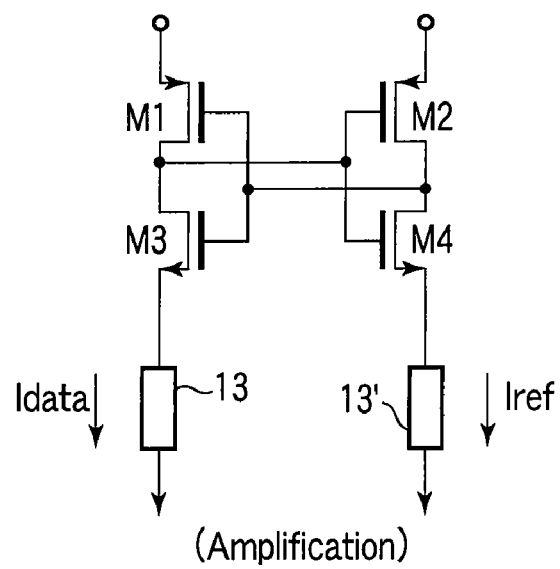
FIG. 9 is a circuit diagram showing an equivalent circuit in an amplification mode to explain the operation in FIG. 7.

FIG. 9 shows an equivalent circuit in an amplification mode. The control signal $\phi 1$ is set at "H", and the transistors M5, M6, and Meq are turned off. The data Out and /Out are electrically discharged at different speeds by a read current to the MRAM cell 13, and the voltages gradually decrease. When the voltages of the data Out and /Out decrease from a power supply voltage VDD by threshold voltages of the transistors M1 and M2, amplification by positive feedback of the latch circuit including the MOS transistors M1 to M4, and the data Out and /Out are determined. At this time, the read current path is identical with a drive current path of the latch circuit, and the control signal $\phi 1$ goes to "H", so that the operation continuously is shifted from the precharge mode to the amplification mode. Also in FIG. 9, the clamp transistors M11 and M12 are omitted.

(c) Latch+Rewrite Mode

Figure 10:
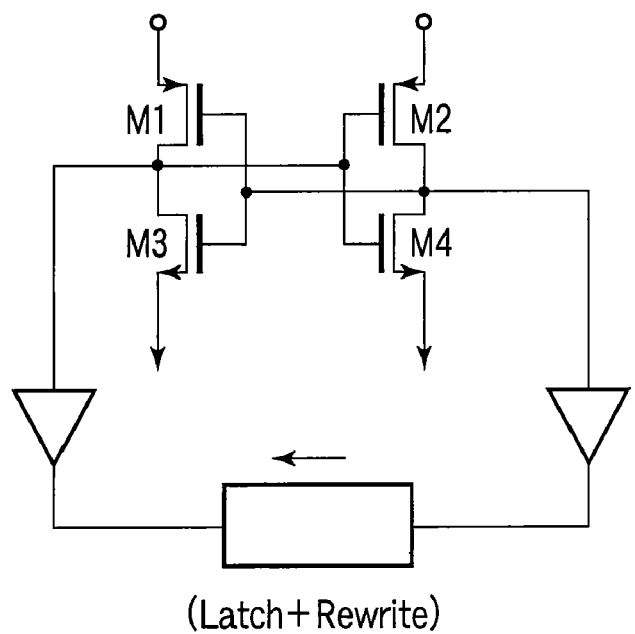
FIG. 10 is a circuit diagram showing an equivalent circuit in an acceleration mode to explain the operation in FIG. 7.

As shown in FIG. 10, when a voltage difference between outputs OUT and /OUT is sufficiently large, the control signal $\phi 3$ is set at "H" to turn the boost transistors M7 and M8 on, and amplification of the latch circuit including the transistors M1 to M4 is accelerated. When an output from the latch circuit, i.e., the data Out and /Out are determined, rewriting is performed. Switches SR11 and SR12 also function as the disconnecting switch SR20 described in the first to fourth embodiments. In the latch+rewrite mode, the latch circuit SA is disconnected from the MRAM cell 13 and the reference cell 13', so that switches SR11 and SR12 have the same function as that of switch SR20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a plurality of word lines;
   a plurality of bit lines arranged to intersect with the word lines;
   an MRAM cell array including a plurality of magnetic random access memory (MRAM) cells arranged at intersection portions between the word lines and the bit lines;
   a read current source which supplies a read current to the MRAM cells in a read mode;
   a sense amplifier which detects terminal voltages of the MRAM cells generated by the read current to generate a detection output signal;
   a latch circuit which latches the detection output signal to output read data; and
   a data write circuit which supplies a write current to the MRAM cells depending on write data in a write mode to perform writing and which supplies the write current to the MRAM cells depending on the read data in the read mode to perform rewriting.

2. The device according to claim 1, further comprising:
   a reference cell having the same structure as that of the MRAM cell; and
   a reference current source which supplies a current equal to the read current to the reference cell to generate a reference voltage,
   wherein the sense amplifier amplifies a difference voltage between the terminal voltage and the reference voltage to generate the detection output signal.

3. The device according to claim 1, wherein the data write circuit includes:
   at least one write power supply;
   a write switch circuit connected to the write power supply and the MRAM cells; and
   a control unit configured (a) to control the write switch circuit depending on the write data in the write mode such that the write current is supplied to the MRAM cell depending on the write data, and (b) to control the write switch circuit depending on the read data in the read mode such that the write current is supplied to the MRAM cell in a direction depending on the read data to perform rewriting.

4. The device according to claim 3, wherein the write switch circuit includes a first write switch connected between the write power supply and one ends of the MRAM cells, a second write switch connected between the other ends of the MRAM cells and a constant potential point, a third write switch connected between the write power supply and the other ends of the MRAM cells, and a fourth write switch connected between one terminals of the MRAM cells and the constant potential point, and
   the control unit is configured (a) to turn on any one of a first pair of the first write switch and the second write switch and a second pair of the third write switch and the fourth write switch depending on the write data in the write mode, and (b) to turn on any one of the first pair and the second pair depending on the read data in the read data.

5. The device according to claim 4, wherein the write data is a combination of a first pulse signal corresponding to a logical value "0" and a second pulse signal corresponding to a logical value "1", the read data is a combination of a third pulse signal corresponding to a logical value "0" and a fourth pulse signal corresponding to a logical value "1", and
   the control unit includes a first OR circuit which calculates a logical sum of the first pulse signal and the third pulse signal to calculate a first logical sum signal and a second OR circuit which calculates a logical sum of the second pulse signal and the fourth pulse signal to calculate a second logical sum signal, and which is configured to control the first pair by the first logical sum signal and to control the second pair by the second logical sum signal.

6. The device according to claim 1, further comprising:
   a switch to disconnect the sense amplifier from the latch circuit during the rewriting performed by the data write circuit.

7. The device according to claim 3, wherein the write power supply is a constant current source.

8. The device according to claim 3, wherein the write power supply is a constant current source common to the read current source.

9. The device according to claim 3, wherein the write power supply is a constant voltage source.

10. A magnetic memory device comprising:
    a plurality of word lines;
    a plurality of bit lines arranged to intersect with the word lines;
    a plurality of magnetic random access memory (MRAM) cells arranged at intersection portions between the word lines and the bit lines;
    a MRAM cell array including a plurality of MRAM cells arranged at the intersection points between the word lines and the bit lines;
    a read current source which supplies a read current to the MRAM cells in a predetermined direction in a read mode;
    a sense amplifier which detects terminal voltages of the MRAM cells generated by the read current to generate a detection output signal;
    a latch circuit which latches the detection output signal to output read data; and
    a data write circuit which supplies a write current to the MRAM cells in a direction depending on write data in a write mode to perform writing and which, when the direction of the write current is different from the direction of the read current in the read mode, supplies the write current to the MRAM cells depending on the read data to perform rewriting.

11. The device according to claim 10, further comprising:
    a reference cell having the same structure as that of the MRAM cell; and
    a reference current source which supplies a constant current equal to the read current to the reference cell to generate a reference voltage,
    wherein the sense amplifier amplifies a difference voltage between the terminal voltage and the reference voltage to generate the detection output signal.

12. The device according to claim 10, wherein the data write circuit includes:
    at least one write power supply;
    a write switch circuit connected to the write power supply and the MRAM cells; and a control unit configured (a) to control the write switch circuit depending on the write data in the write mode such that the write current is supplied to the MRAM cell depending on the write data, and (b) to control the write switch circuit depending on the read data in the read mode such that the write current is supplied to the MRAM cell in a direction depending on the read data to perform rewriting only when the direction of the write current is different from the direction of the read current.

13. The device according to claim 10, wherein the write switch circuit includes a first write switch connected between the write power supply and one ends of the MRAM cells, a second write switch connected between the other ends of the MRAM cells and a constant potential point, a third write switch connected between the write power supply and the other ends of the MRAM cells, and a fourth write switch connected between one terminals of the MRAM cells and the constant potential point, and the control unit is configured (a) to turn on any one of a first pair of the first write switch and the second write switch and a second pair of the third write switch and the fourth write switch depending on the write data in the write mode, and (b) to turn on any one of the first pair and the second pair depending on the read data in the read data, the pair being present on a path of the read current.

14. The device according to claim 13, wherein the write data is a combination of a first pulse signal corresponding to a logical value "0" and a second pulse signal corresponding to a logical value "1", the read data is a combination of a third pulse signal corresponding to a logical value "0" and a fourth pulse signal corresponding to a logical value "1", and the control unit includes an OR circuit which calculates any one of a logical sum of the first pulse signal and the third pulse signal and a logical sum of the second pulse signal and the fourth pulse signal to calculate a logical sum signal, and is configured to turn on any one of the first pair and the second pair by any one of the first pulse signal and the second pulse signal and the logical sum signal.

15. The device according to claim 10, further comprising:
a switch to disconnect the sense amplifier from the latch circuit during the rewriting performed by the data write circuit.

16. The device according to claim 12, wherein the write power supply is a constant current source.

17. The device according to claim 12, wherein the write power supply is a constant current source common to the read current source.

18. The device according to claim 12, wherein the write power supply is a constant voltage source.

* * * * *